United States Patent
Yang

(10) Patent No.: US 8,468,432 B2
(45) Date of Patent: Jun. 18, 2013

(54) CODER-DECODER AND METHOD FOR ENCODING AND DECODING AN ERROR CORRECTION CODE

(75) Inventor: Tsung-Chieh Yang, Hsinchu (TW)

(73) Assignee: Silicon Motion, Inc., Jhubei (TW)

( * ) Notice: Subject to any disclaimer, the term of this patent is extended or adjusted under 35 U.S.C. 154(b) by 401 days.

(21) Appl. No.: 12/785,778

(22) Filed: May 24, 2010

(65) Prior Publication Data

US 2011/0004812 A1 Jan. 6, 2011

Related U.S. Application Data

(60) Provisional application No. 61/222,468, filed on Jul. 1, 2009.

(30) Foreign Application Priority Data

Aug. 10, 2009 (TW) ................................ 98126686 A

(51) Int. Cl.
*H03M 13/00* (2006.01)

(52) U.S. Cl.
USPC ............ 714/782; 714/781; 714/784; 714/785

(58) Field of Classification Search
USPC ................. 714/781, 782, 784, 785, 755, 786, 714/758, 746; 360/31
See application file for complete search history.

(56) References Cited

U.S. PATENT DOCUMENTS

| | | | | |
|---|---|---|---|---|
| 5,610,929 A * | 3/1997 | Yamamoto | | 714/785 |
| 5,872,799 A * | 2/1999 | Lee et al. | | 714/755 |
| 6,163,871 A * | 12/2000 | Yang | | 714/769 |
| 6,360,349 B1 * | 3/2002 | Kawanishi | | 714/785 |
| 6,473,880 B1 * | 10/2002 | Cypher | | 714/800 |
| 6,662,331 B1 * | 12/2003 | Kang | | 714/755 |
| 6,738,935 B1 * | 5/2004 | Kimmitt | | 714/701 |
| 6,903,887 B2 * | 6/2005 | Asano et al. | | 360/31 |
| 7,426,676 B2 * | 9/2008 | Vityaev | | 714/769 |
| 7,458,007 B2 * | 11/2008 | Sankaran et al. | | 714/782 |

FOREIGN PATENT DOCUMENTS

| | | |
|---|---|---|
| KR | 19910000156 B1 | 1/1991 |
| KR | 20080043679 A | 5/2008 |
| WO | 2009/036004 A2 | 3/2009 |

OTHER PUBLICATIONS

Office Action of corresponding CN application issued on May 18, 2012.
Office Action of corresponding KR application, issued on Feb. 28, 2013.

* cited by examiner

*Primary Examiner* — Phung M Chung
(74) *Attorney, Agent, or Firm* — Wang Law Firm, Inc.; Li K. Wang; Stephen Hsu

(57) ABSTRACT

The invention provides a method for encoding and decoding an error correction code. First, raw data is received and then divided into a plurality of data segments. A plurality of short parities corresponding to the data segments is then generated according to a first generator polynomial. The short parities are then appended to the data segments to obtain a plurality of short codewords. The short codewords are then concatenated to obtain a code data. A long parity corresponding to the code data is then generated according to a second generator polynomial, wherein the first generator polynomial is a function of at least one minimum polynomial of the second generator polynomial. Finally, the long parity is then appended to the code data to obtain a long codeword as an error correction code corresponding to the raw data.

20 Claims, 10 Drawing Sheets

CODER-DECODER AND METHOD FOR ENCODING AND DECODING AN ERROR CORRECTION CODE

CROSS REFERENCE TO RELATED APPLICATIONS

This application claims the benefit of U.S. Provisional Application No. 61/222,468, filed on Jul. 1, 2009, the entirety of which is incorporated by reference herein.

This Application claims priority of Taiwan Patent Application No. 98126686, filed on Aug. 10, 2009, the entirety of which is incorporated by reference herein.

BACKGROUND OF THE INVENTION

1. Field of the Invention

The invention relates to error correction codes, and more particularly to encoding and decoding of error correction codes.

2. Description of the Related Art

After data is converted into an error correction code, if errors occur in the error correction code, the data without errors can be recovered according to a parity of the error correction code. Data of a transmitter in a communication system is often encoded to obtain an error correction code to be transmitted to a receiver of a communication system. After the receiver of the communication system receives the error correction code, if errors occur in the error correction code due to a transmission process, the receiver can correct the errors of the received error correction code and then recover the data without errors. Similarly, a data storage system often encodes data to obtain an error correction code to be stored in a storage medium. When errors occur in the error correction code stored in the storage medium, the data storage system can decode the error correction code to recover the data without errors. An error correction code may be a Bose, Ray-Chaudhuri, and Hocquenghem (BCH) code or a Reed-Solomon (RS) code. Data to be stored in a flash memory is often converted into a BCH code, and data to be stored in an optical disk is often converted to a RS code.

After a data storage system retrieves an error correction code from a storage medium, the error correction code must be decoded to recover data stored therein. Referring to FIG. 1, a flowchart of a conventional method 100 for decoding an error correction code is shown. First, a decoder receives an error correction code (step 102). The decoder then calculates a plurality of syndromes according to a parity of the error correction code (step 104). The decoder then determines whether the syndromes are all equal to zero (step 106). When the syndromes are all equal to zero, no error has occurred in the error correction code, and no correction is required. When some of the syndromes are not equal to zero, errors have occurred in the error correction code, and the error correction code requires correction. First, the decoder calculates a plurality of coefficients of an error location polynomial according to the syndromes (step 108). The decoder then performs a Chien search to find a plurality of roots of the error location polynomial according to the coefficients of the error location polynomial (step 110). Because the roots of the error location polynomial indicate the positions of error bits in the error correction code, the decoder can then correct the error bits of the error correction code according to the roots (step 112), and then obtain an error correction code without errors.

Calculation of the coefficients of the error location polynomial in step 108 requires a long time period. Similarly, performing the Chien search in step 110 also requires a long time period to calculate the roots of the error location polynomial. According to the conventional method 100, the steps 108 and 110 are performed to correct error bits of the error correction code when any of the syndromes are not equal to zero, thus causing a delay in the decoding process and degrading system performance. When some of the syndromes are not equal to zero, if the error correction code is corrected in a method that avoids calculation of the coefficients and the roots of the error location polynomial in steps 108 and 110, respectively, the delay period of the decoding process may be reduced, and performance of the decoder and the data storage system may be improved. Thus, a new method for encoding and decoding an error correction code is required.

BRIEF SUMMARY OF THE INVENTION

The invention provides a method for encoding and decoding an error correction code. First, raw data is received and then divided into a plurality of data segments. A plurality of short parities corresponding to the data segments is then generated according to a first generator polynomial. The short parities are then appended to the data segments to obtain a plurality of short codewords. The short codewords are then concatenated to obtain a code data. A long parity corresponding to the code data is then generated according to a second generator polynomial, wherein the first generator polynomial is a function of at least one minimum polynomial of the second generator polynomial. Finally, the long parity is then appended to the code data to obtain a long codeword as an error correction code corresponding to the raw data.

The invention provides a coder-decoder for an error correction code. In one embodiment, the coder-decoder comprises an error correction code (ECC) encoder and an error correction code (ECC) decoder. The ECC encoder receives raw data, divides the raw data into a plurality of data segments, generates a plurality of short parities corresponding to the data segments, appends the short parities to the data segments to obtain a plurality of short codewords, concatenates the short codewords to obtain a code data, generating a long parity corresponding to the code data, and appends the long parity to the code data to obtain a long codeword as an error correction code to be stored in a storage medium. The ECC decoder reads the long codeword from the storage medium, retrieves the short codewords from the long codeword, calculates a plurality of short syndromes corresponding to the short codewords according to the short parities of the short codewords, determines whether the short syndromes are equal to zero, and when the short syndromes comprise nonzero short syndromes, corrects the short codewords according to the nonzero short syndromes.

The invention also provides a method for decoding an error correction code. First, a long codeword of an error correction code is received, wherein the long codeword comprises a plurality of short codewords and a long parity, and each of the short codewords comprises a short parity. The short codewords are then retrieved from the long codeword. A plurality of short syndromes corresponding to the short codewords is then calculated according to the short parities of the short codewords. Whether the short syndromes are equal to zero is then determined. When the short syndromes comprise nonzero short syndromes, the short codewords are corrected according to the nonzero short syndromes. A long syndrome corresponding to the long codeword is then calculated according to the long parity of the long codeword. Whether the long syndrome is equal to zero is then determined. When the long syndrome is not equal to zero, whether the nonzero short codewords have successfully corrected the corresponding short codewords is then determined. When the nonzero short codewords have successfully corrected the corresponding short codewords, the long syndrome is corrected according to the nonzero short codewords to obtain a corrected long syndrome.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
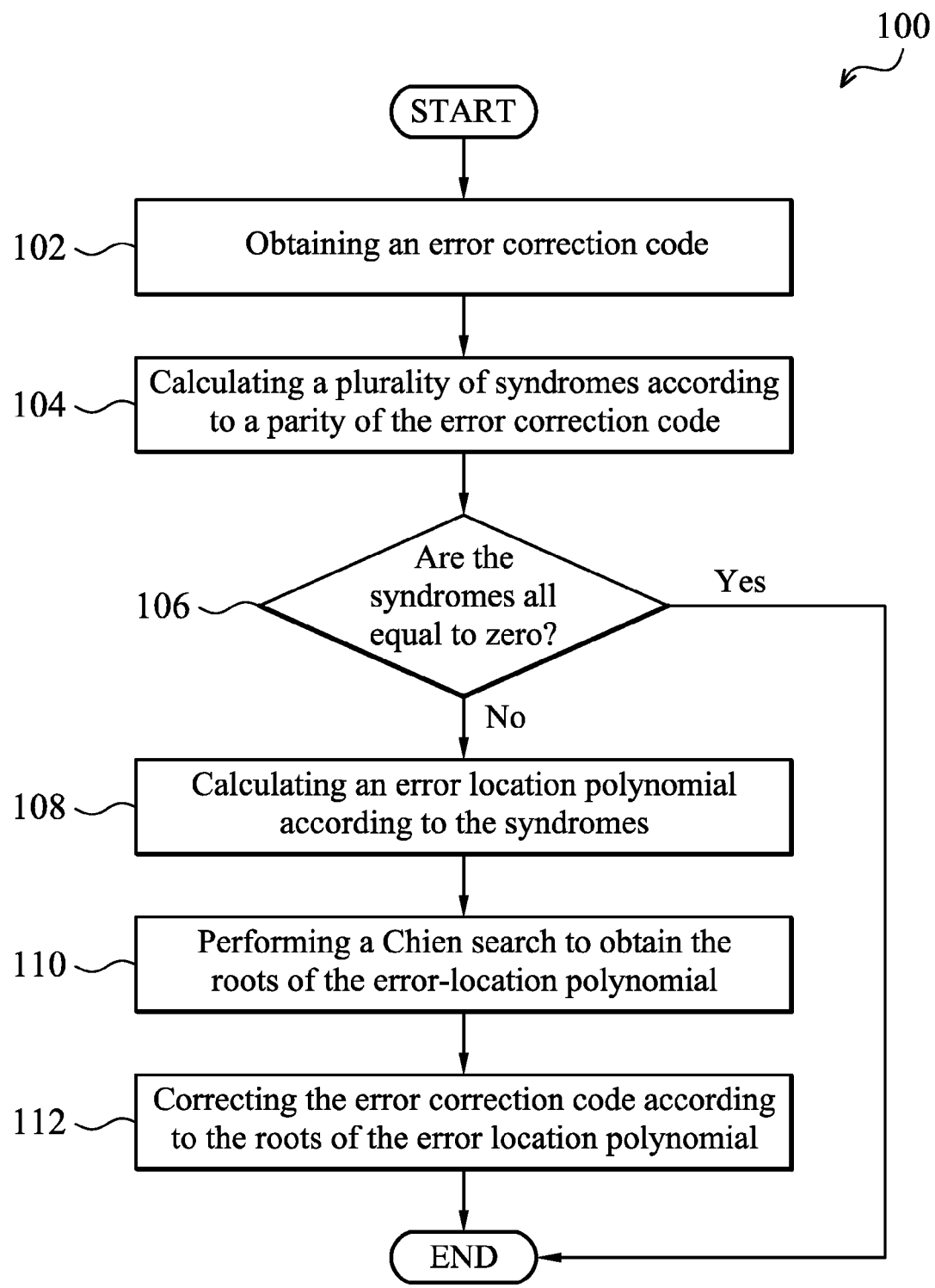
FIG. 1 is a flowchart of a conventional method for decoding an error correction code.
Figure 2:
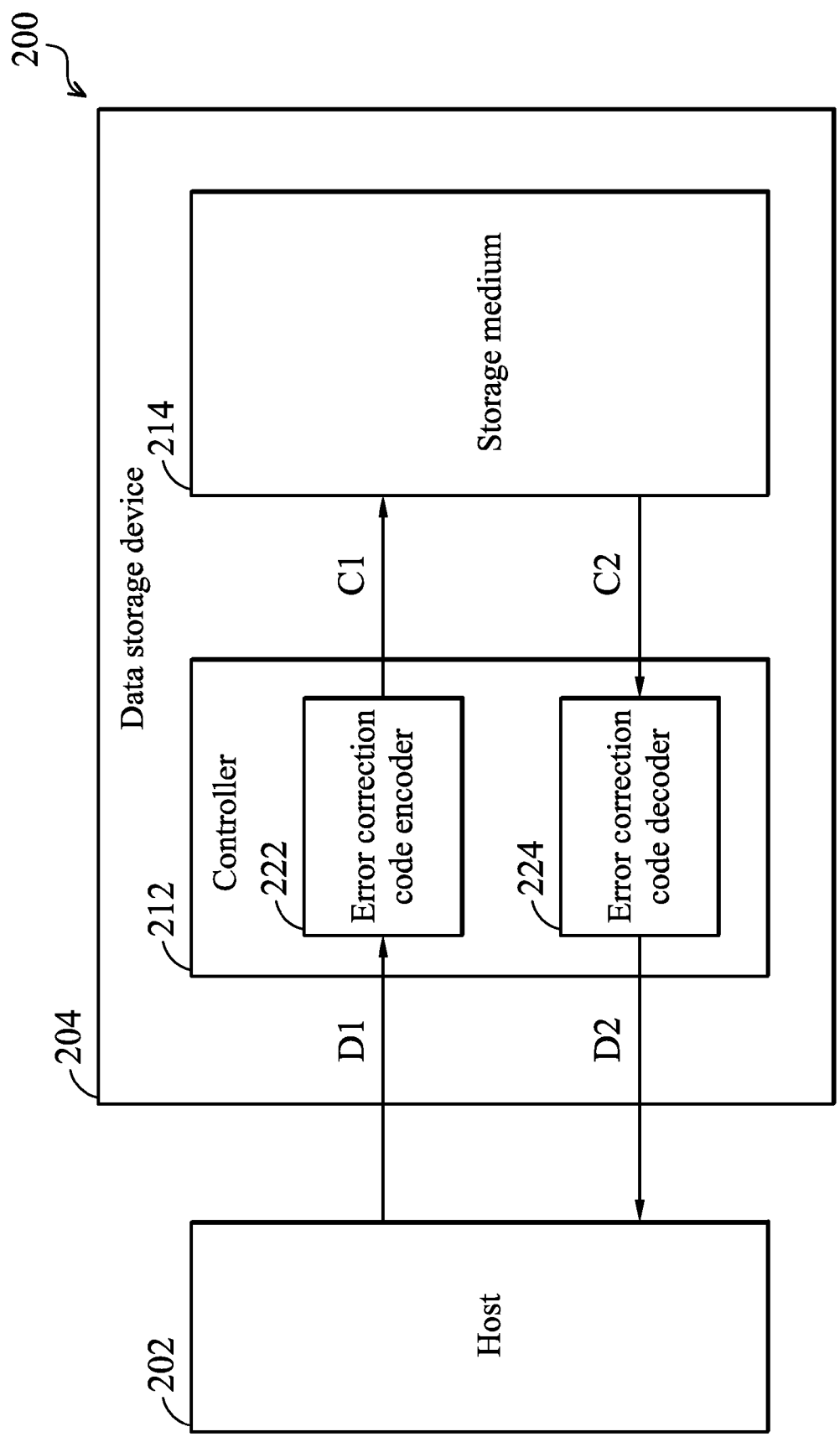
FIG. 2 is a block diagram of a data storage system according to the invention.

Referring to FIG. 2, a block diagram of a data storage system 200 according to the invention is shown. In one embodiment, the data storage system 200 comprises a controller 212 and a storage medium 214. In one embodiment, the controller 212 comprises an error correction code (ECC) encoder 222 and an error correction code (ECC) decoder 224. When a host 202 wants to store data D1 to the data storage device 204, the controller 212 first encodes the data D1 to obtain an error correction code C1, and then stores the error correction code C1 to the storage medium 214. When the host 202 wants to retrieve the data D2 from the data storage device 204, the controller 212 first reads an error correction code C2 from the storage medium 214, then decodes the error correction code C2 to obtain data D2, and then sends the data D2 to the host 202. In one embodiment, the data storage device 204 is a memory card, the storage medium 214 is a flash memory, and the error correction codes C1 and C2 are BCH codes. In another embodiment, the data storage device 204 is an optical disk, the storage medium 214 is an optical disk, and the error correction codes C1 and C2 are RS codes. The types of the storage medium 214 and the error correction codes C1 and C2 are not intended to limit the scope of the invention and those skilled in the art can apply the invention to any type of storage media and error correction code.

Figure 3A:
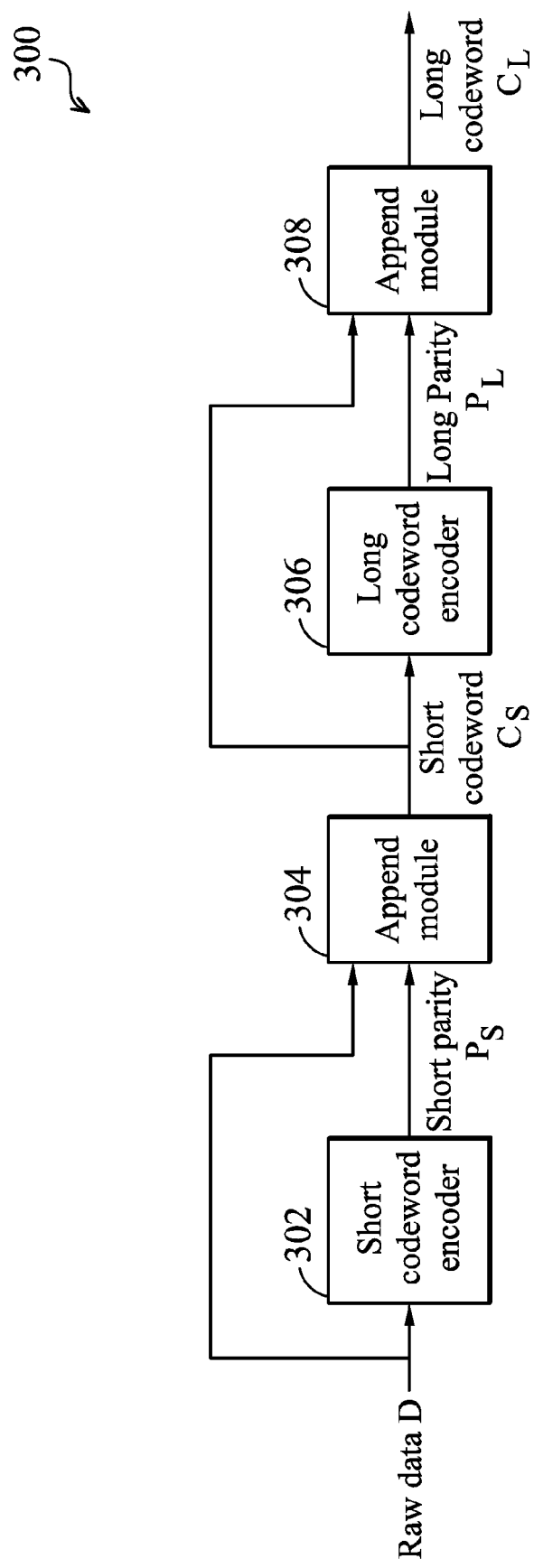
FIG. 3A is a block diagram of an error correction code encoder according to the invention.
Figure 3B:
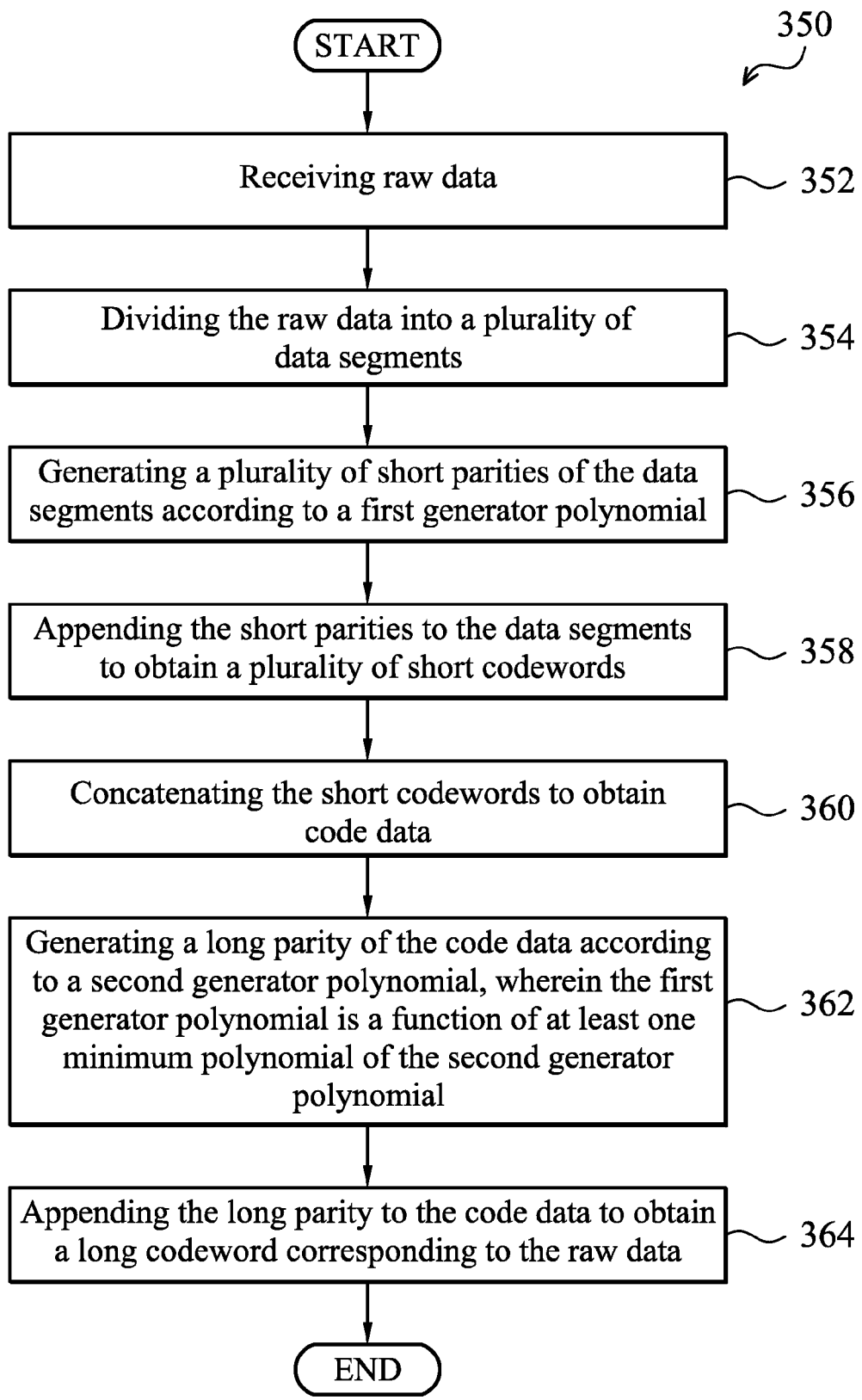
FIG. 3B is a flowchart of a method for generating an error correction code according to the invention.

Referring to FIG. 3A, a block diagram of an error correction code encoder 300 according to the invention is shown. In one embodiment, the ECC encoder 300 comprises a short codeword encoder 302, an append module 304, a long codeword encoder 306, and an append module 308. Referring to FIG. 3B, a flowchart of a method 350 for generating an error correction code according to the invention is shown. The ECC encoder 300 shown in FIG. 3A encodes raw data D to obtain a long codeword $C_L$ as an error correction code according to the method 350 shown in FIG. 3B. First, the ECC encoder 300 receives raw data D (step 352). The ECC decoder 300 then divides the raw data D into a plurality of data segments (step 354). When the short codeword encoder 302 receives the data segments, the short codeword encoder 302 sequentially generates a plurality of short parities $P_S$ respectively corresponding to the data segments according to a first generator polynomial (step 356).

The append module 304 then respectively appends the short parities $P_S$ to the data segments to obtain a plurality of short codewords $C_S$ (step 358). The long codeword encoder 306 then concatenates the short codewords $C_S$ to obtain code data (step 360), and then generates a long parity $P_L$ corresponding to the code data according to a second generator polynomial (step 362), wherein the first generator polynomial of the short codeword encoder 302 is a function of at least one minimum polynomial of the second generator polynomial of the long codeword encoder 306. In one embodiment, the first generator polynomial is a least common multiple (LCM) of at least one minimum polynomial of the second generator polynomial. Finally, the append module 308 appends the long parity $P_L$ to the code data to obtain a long codeword $C_L$ (step 364). For example, assume that a second generator polynomial g(x) of the long codeword encoder 306 is a least common multiple $\{\psi_1(x) \times \psi_2(x) \times \ldots \times \psi_k(x)\}$ of a plurality of minimum polynomials $\psi_1(x), \psi_2(x), \ldots, \psi_k(x)$. In one embodiment, the first generator polynomial g'(x) of the short codeword encoder 302 is the minimum polynomial $\psi_1(x)$. In another embodiment, the first generator polynomial g'(x) of the short codeword encoder 302 is a least common multiple $[\psi_1(x) \times \psi_2(x)]$ of the minimum polynomials $\psi_1(x)$ and $\psi_2(x)$.

Figure 4:
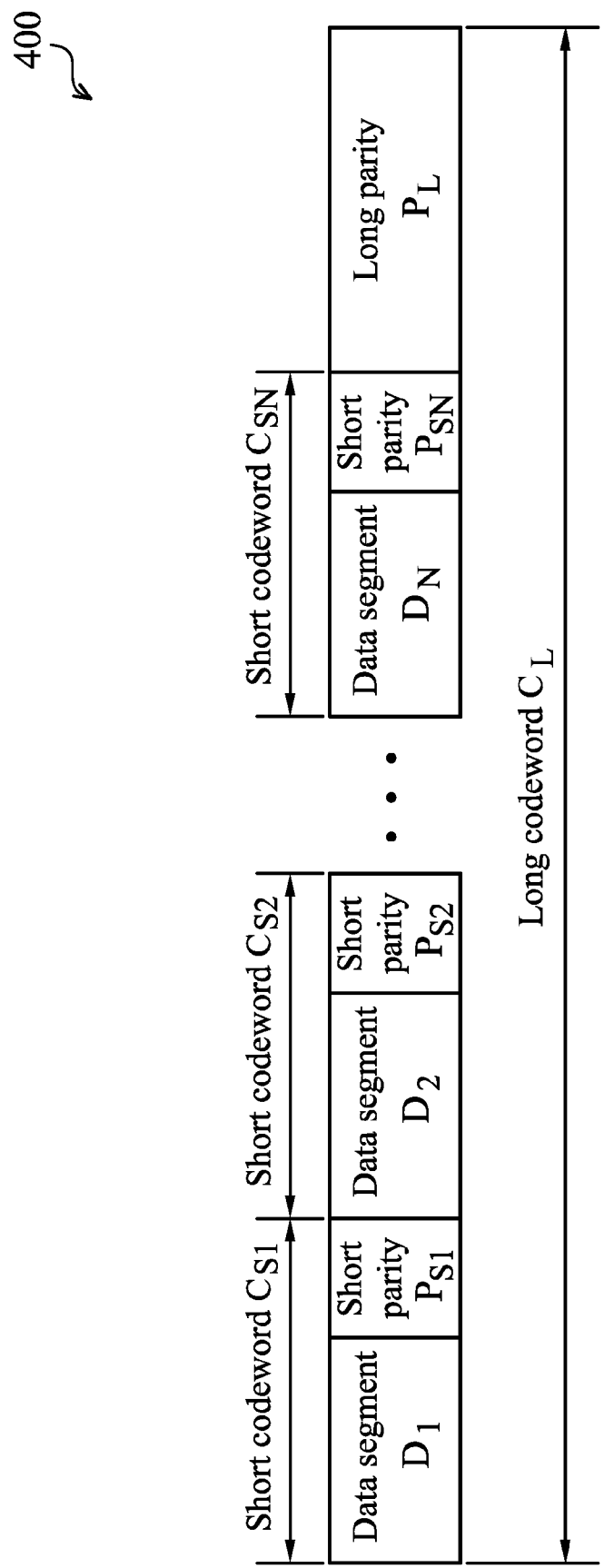
FIG. 4 is a schematic diagram of a long codeword generated according to the invention.

Referring to FIG. 4, a schematic diagram of a long codeword $C_L$ generated according to the invention is shown. The long codeword $C_L$ comprises N short codewords $C_{S1}, C_{S2}, \ldots, C_{SN}$ and a long parity $P_L$. Each of the short codewords $C_{S1}, C_{S2}, \ldots, C_{SN}$ comprises a data segment and a short parity. For example, the short codeword $C_{S1}$ comprises a data segment $D_1$ and a short parity $P_{S1}$, the short codeword $C_{S2}$ comprises a data segment $D_2$ and a short parity $P_{S2}$, and the short codeword $C_{SN}$ comprises a data segment $D_N$ and a short parity $P_{SN}$. Raw data is divided into N data segments $D_1, D_2, \ldots, D_N$, and the raw data is encoded by the ECC encoder 300 shown in FIG. 3A to obtain the long codeword $C_L$ shown in FIG. 4.

Figure 5:
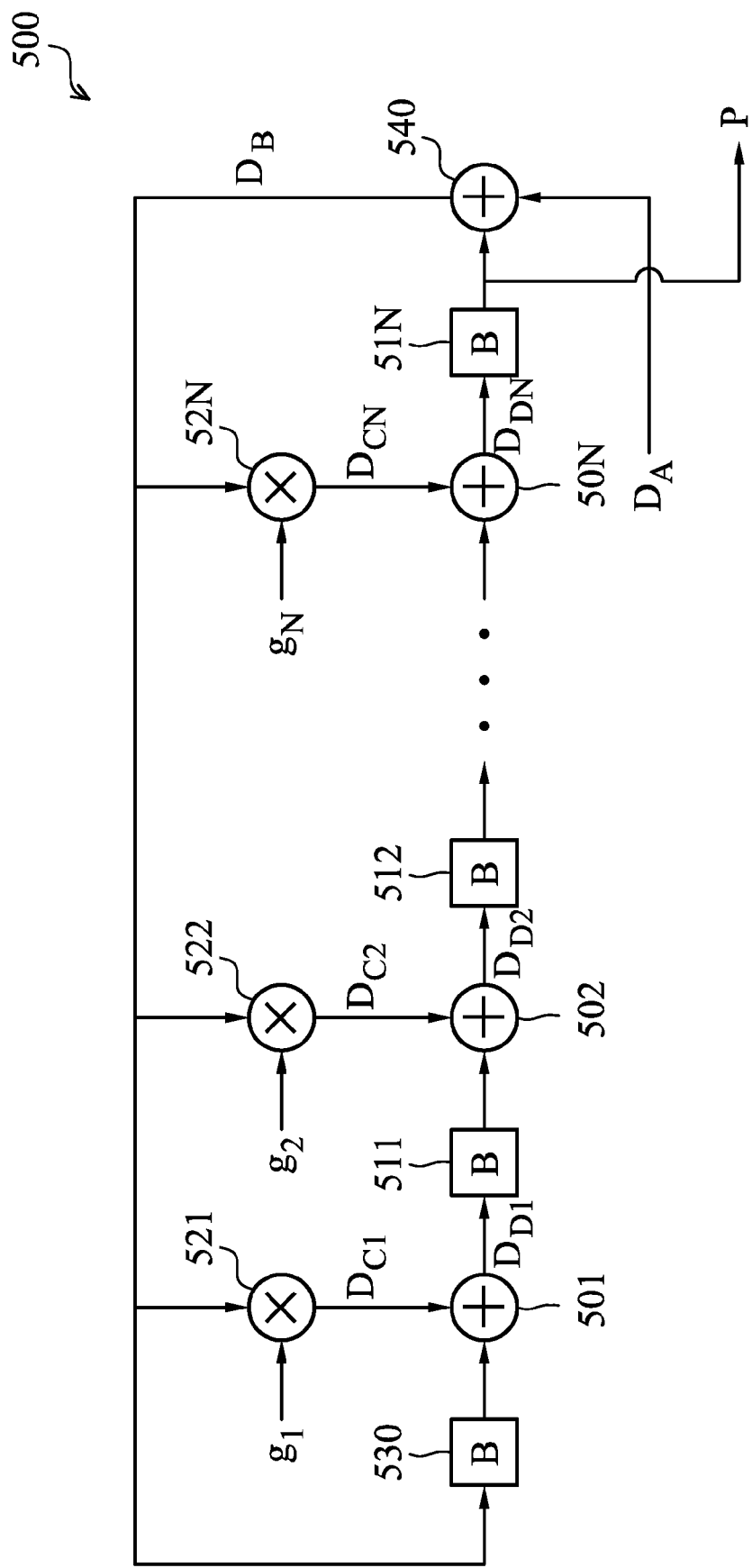
FIG. 5 is a circuit diagram of an encoder according to the invention.

Referring to FIG. 5, a circuit diagram of an encoder 500 according to the invention is shown. The encoder 500 may be the short parity encoder 302 or the long parity encoder 306 shown in FIG. 3A. Assume that the encoder 500 converts data DA into a parity P according to a generator polynomial g(x), and the generator polynomial g(x) has a first-order term coefficient $g_1$, a second order term coefficient $g_2, \ldots$, and an N-th order term coefficient $g_N$. The encoder 500 comprises an adder 540, multipliers 521~52N, adders 501~50N, and buffers 511~51N and 530. Bits of the data $D_A$ are sequentially delivered to the adder 540. The adder 540 sequentially adds the bits of the data $D_A$ to the data bits $D_{BN}$ stored in the buffer 51N to obtain data $D_B$. the multipliers 521, 522, ..., 52N then respectively multiplies the data bits $D_B$ by the coefficients $g_1, g_2, \ldots, g_N$ of the generator polynomial g(x) to respectively obtain data $D_{C1}, D_{C2}, \ldots, D_{CN}$. Data $D_B$ is stored in the buffer 530. The adders 501, 502, ..., 50N then sequentially add data $D_{C1}, D_{C2}, \ldots, D_{CN}$ to the data $D_B$ output by the buffer 530 to obtain data $D_{DN}$. Finally, the buffer 51N stores the data $D_{DN}$ and then outputs the data $D_{DN}$ as the parity P.

Figure 6:
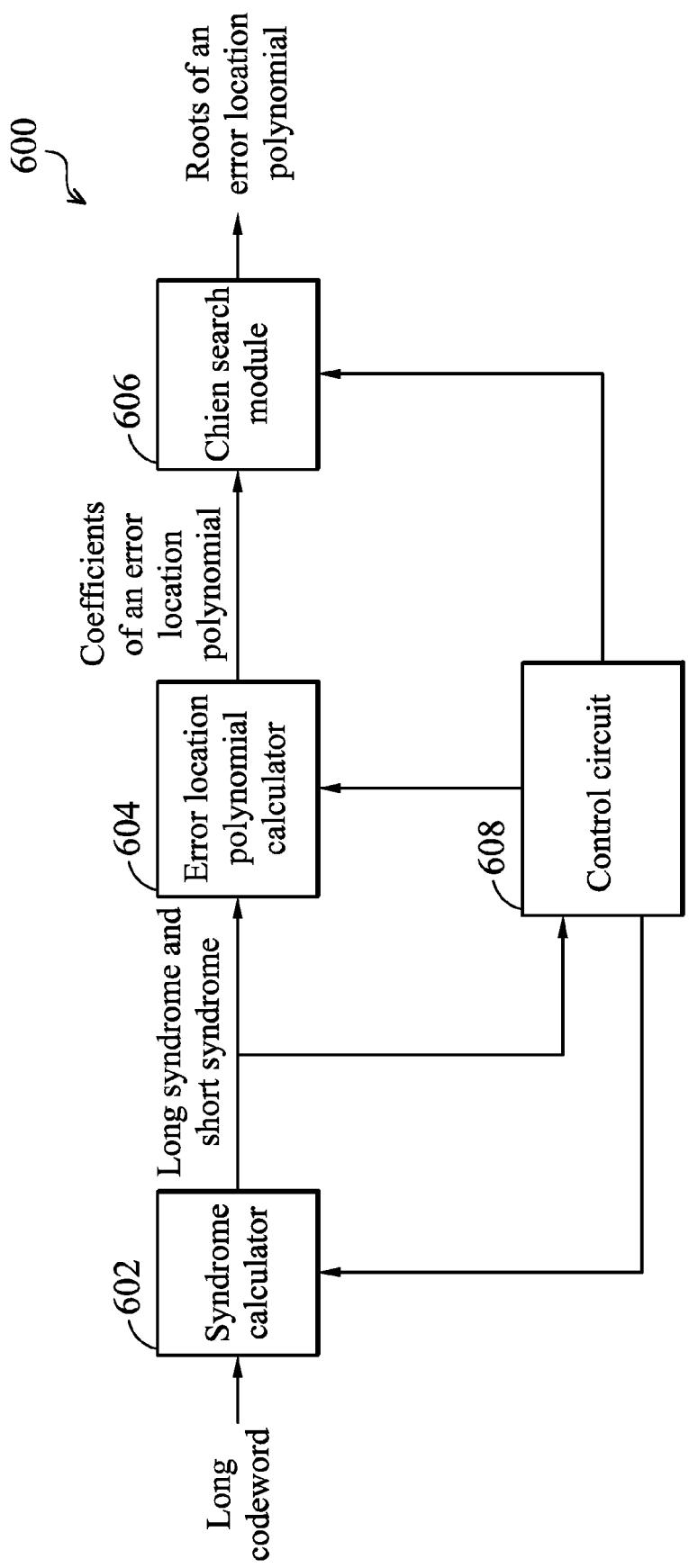
FIG. 6 is a block diagram of an error correction code (ECC) decoder according to the invention.

Referring to FIG. 6, a block diagram of an error correction code (ECC) decoder 600 according to the invention is shown. In one embodiment, the ECC decoder 600 comprises a syndrome calculator 602, an error location polynomial calculator 604, a Chien search module 606, and a control circuit 608. When the ECC decoder 600 receives a long codeword of an error correction code, the ECC decoder 600 retrieves a plurality of short codewords from the long codeword. First, the syndrome calculator 602 calculates a plurality of short syndromes $S_{1a}, S_{1b}, \ldots, S_{1N}$ of the short codewords according to short parities of the short codewords, and calculates a plurality of long syndromes $S_1, S_2, \ldots, S_k$ of the long codeword according to a long parity of the long codeword. The error location polynomial calculator 604 then calculates coefficients of an error location polynomial of the long codeword according to the long syndromes $S_1, S_2, \ldots, S_k$ of the long codeword. The Chien search module 606 then finds roots of the error location polynomial for correcting the long codeword of the error correction code. Meanwhile, when the short syndromes $S_{1a}, S_{1b}, \ldots, S_{1N}$ of the short codewords are not equal to zero, the error location polynomial calculator 604 calculates coefficients of error location polynomials of the short codewords according to nonzero short syndromes, and the Chien search module 606 then performs a Chien search to find roots of the error location polynomials of the short codewords for correcting the short codewords. The control circuit 608 determines whether the long syndromes $S_1, S_2, \ldots, S_k$ are equal to zero, and stops coefficient calculation of the error location polynomial calculator 604 and root search of the Chien search module 606. The control circuit 608 also has other functions to reduce the time period required for decoding the long codeword and improve performance of the ECC decoder 600. The functions of the ECC decoder 600 are further illustrated with FIG. 8.

Figure 7:
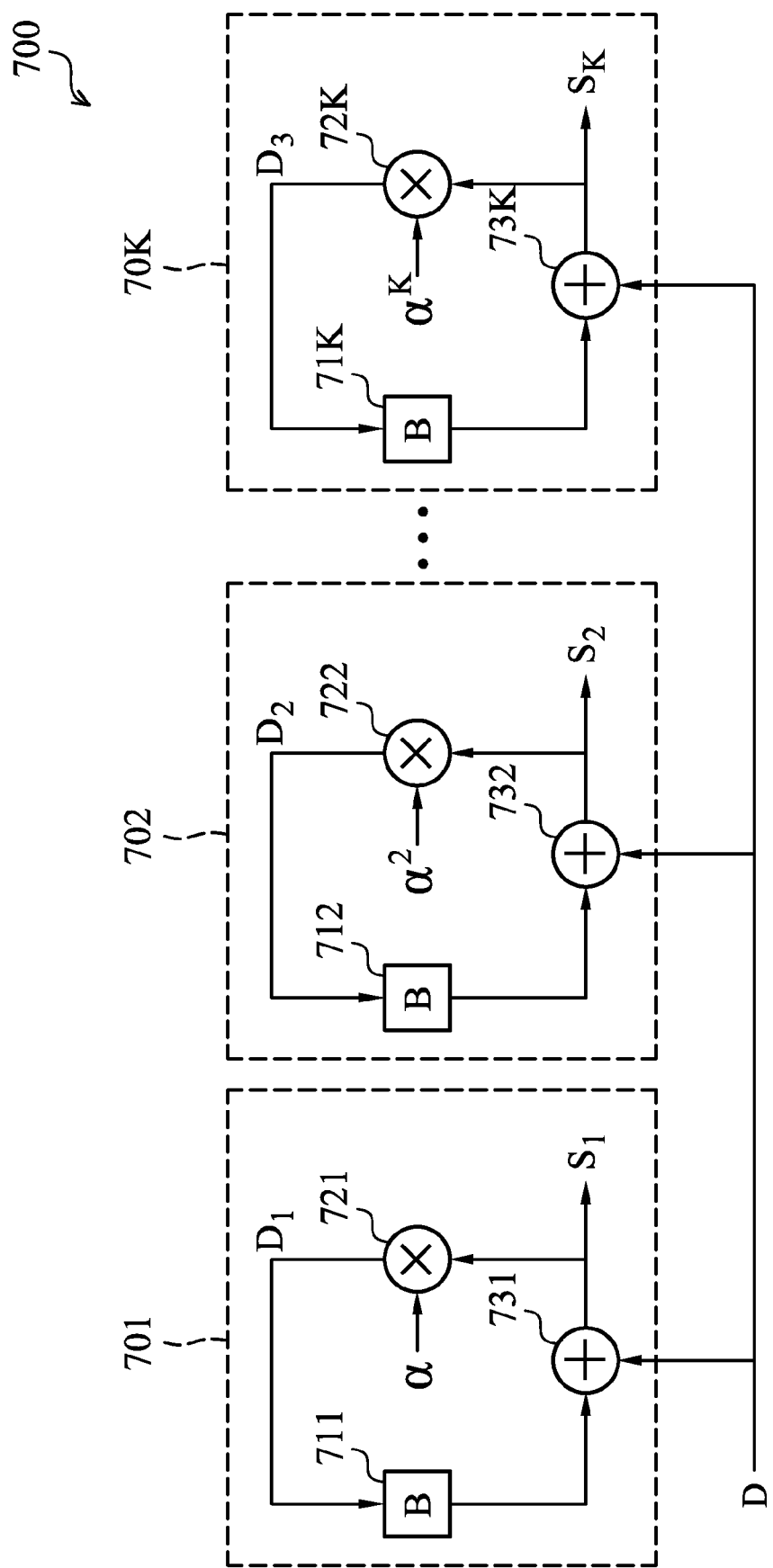
FIG. 7 is a circuit diagram of a syndrome calculator according to the invention.

In one embodiment, the first generator polynomial for encoding the short codewords is a function of at least one minimum polynomial of the second generator polynomial for encoding the long codewords. The syndrome calculator 602 therefore can generate the short codewords and the long codewords with the same circuit. Referring to FIG. 7, a circuit diagram of a syndrome calculator 700 according to the invention is shown. The syndrome calculator 700 comprises a plurality of syndrome generators 701, 702, . . . , 70K for respectively generating the long syndromes $S_1, S_2, \ldots, S_K$ of the long codewords. The syndrome generator 701 also generates a plurality of short syndromes $S_{1a}, S_{1b}, \ldots, S_{1N}$ of a plurality of short codewords. In one embodiment, data bits D of a long codeword are sequentially delivered to the syndrome generators 702, . . . , 70K. When processing of the data bits D of the long codeword have been completed, the syndrome generators 702, . . . , 70K respectively generate the long syndromes $S_2, \ldots, S_K$ of the long codeword. The data bits D of the long codeword comprising a plurality of short codewords are simultaneously delivered to the syndrome generator 701. When processing of data bits D of a short codeword is completed, the syndrome generator 701 generates a short syndrome corresponding to the short codeword. For example, when a short codeword $C_{S1}$ comprising a data segment $D_1$ and a short parity $P_{S1}$ is delivered to the syndrome generator 701, the syndrome generator 701 generates a short syndrome corresponding to the short codeword $C_{S1}$. When a short codeword $C_{S2}$ comprising a data segment $D_2$ and a short parity $P_{S2}$ is delivered to the syndrome generator 701, the syndrome generator 701 generates a short syndrome corresponding to the short codeword $C_{S2}$. Because the long codeword comprises a plurality of short codewords, after processing of all short codewords of the long codeword is completed, the syndrome generator 701 generates the long syndrome $S_1$ corresponding to the long codeword.

Each of the syndrome generators 701, 702, . . . , 70K shown in FIG. 7 comprises an adder, a multiplier, and a buffer. For example, the syndrome generator 701 comprises an adder 731, a multiplier 721, and a buffer 711. The buffer 711 buffers data $D_1$ and then outputs the data $D_1$. The adder 731 adds the data $D_1$ output by the buffer 711 to the data bit D off the long codeword to obtain a data bit of a first syndrome $S_1$. The multiplier 721 multiplies the data bit of the first syndrome $S_1$ by a coefficient $\alpha$ to obtain a new bit of the data $D_1$, and the new bit of the data $D_1$ is then delivered to the buffer 711 for storage. The coefficient $\alpha$ is a common root of the first generator polynomial and the second generator polynomial, and the coefficients of the syndrome generators 702, . . . , 70K are respectively $\alpha^2, \ldots, \alpha^K$, wherein $\alpha^2, \ldots, \alpha^K$ are also roots of the second generator polynomial for encoding the long codeword.

Figure 8A:
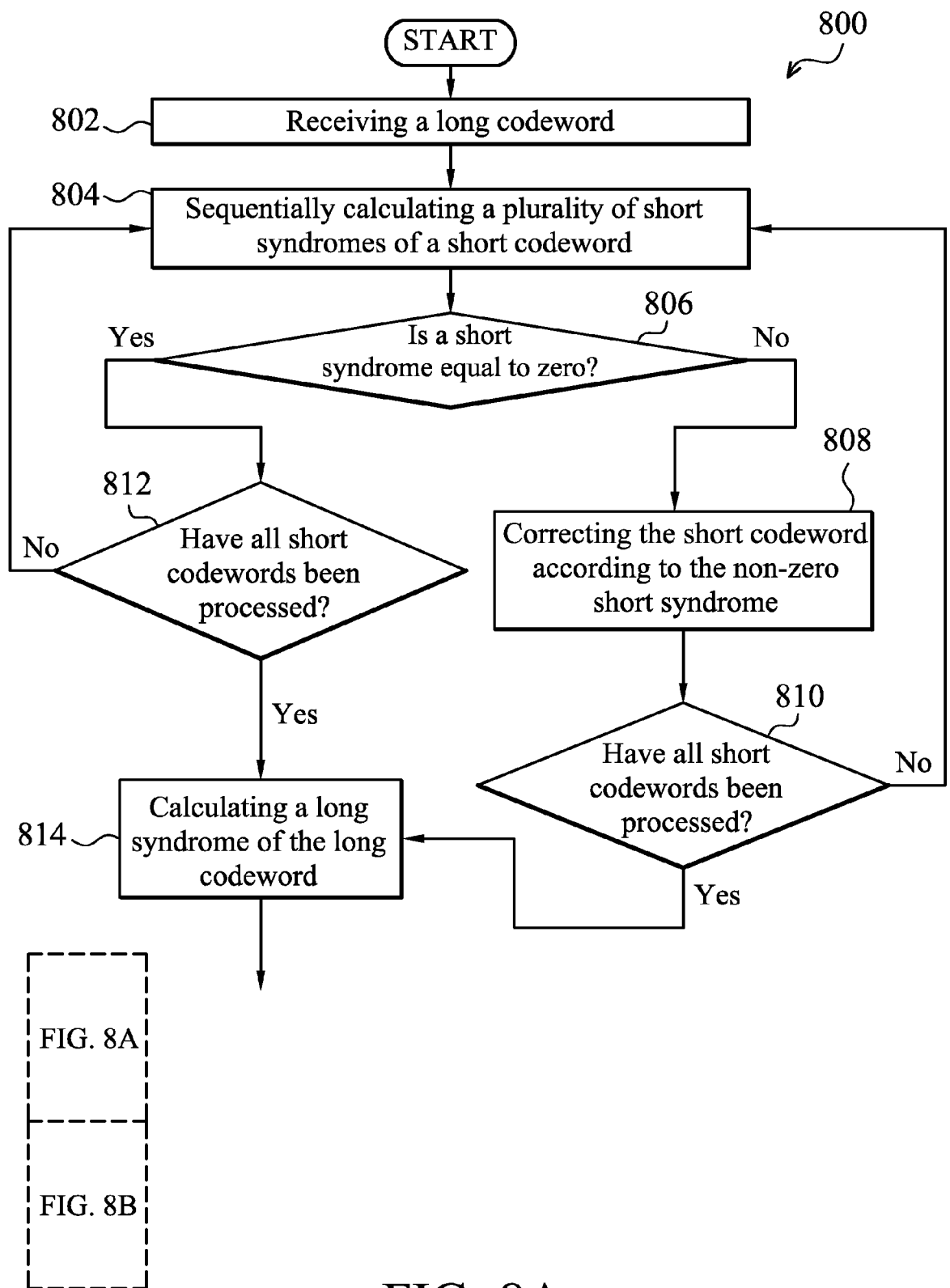
FIG. 8 is a flowchart of a method for decoding an error correction code according to the invention.
Figure 8B:
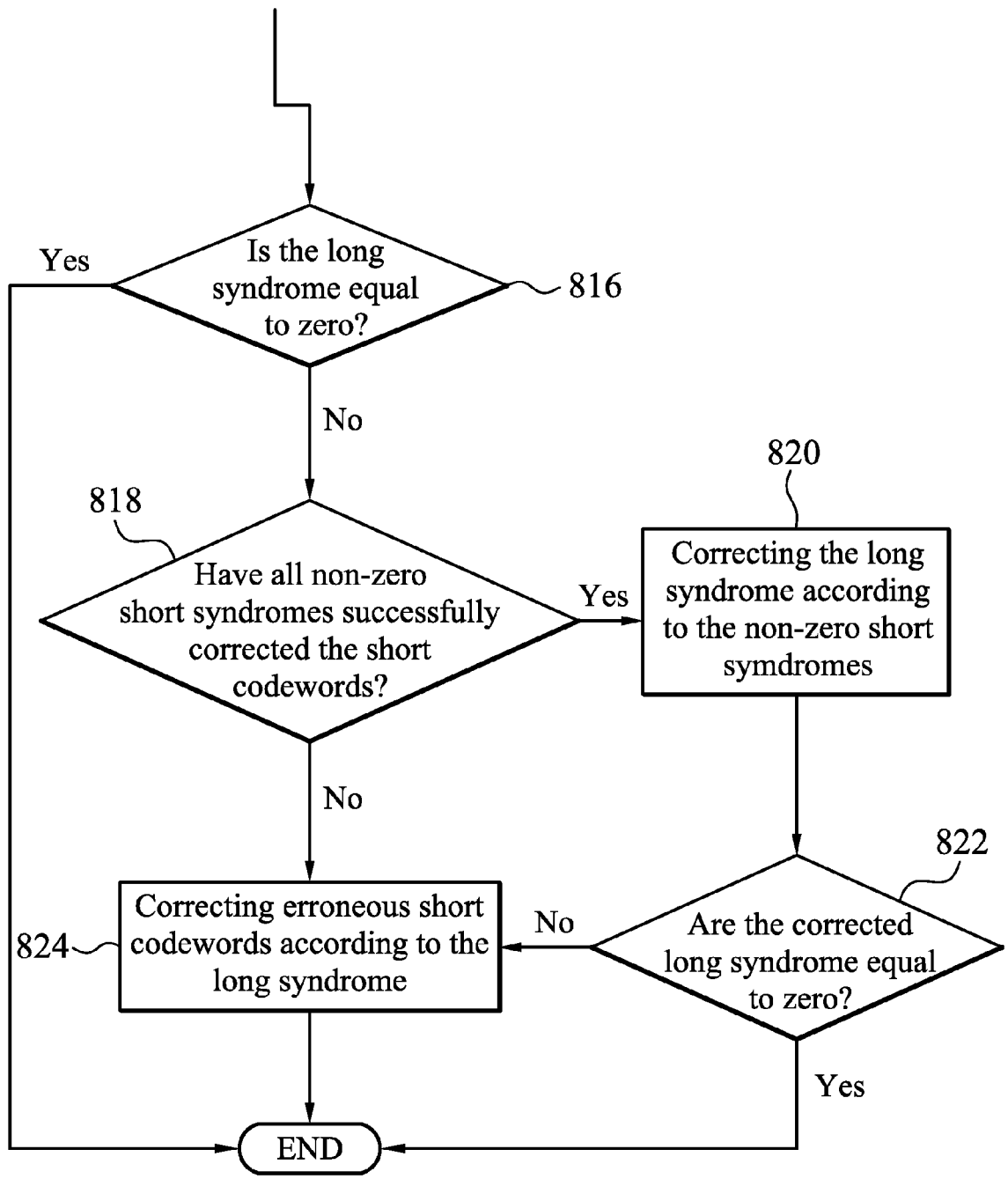

Referring to FIG. 8, a flowchart of a method 800 for decoding an error correction code according to the invention is shown. The ECC decoder 600 shown in FIG. 6 decodes an error correction code according to the method 800. First, the ECC decoder 600 receives a long codeword (step 802). The syndrome calculator 602 then sequentially calculates a plurality of short syndromes of a short codeword of the long codeword (step 804). For example, the ECC decoder 600 first processes a first short codeword $C_S$ of the long codeword $C_L$. The control circuit 608 then determines whether the short syndromes generated by the syndrome calculator 602 are equal to zero (step 806). When a short syndrome is equal to zero, the short codeword corresponding to the short syndrome is correct, and the syndrome calculator 602 continues to calculate the short syndromes of other short codewords $C_{S2}, C_{S3}, \ldots, C_{SN}$ until all short codewords of the long codeword have been processed by the syndrome calculator 602 (step 812). When a short syndrome is not equal to zero, the short codeword corresponding to the short syndrome comprises error bits, and the control circuit 608 corrects the short codeword according to the non-zero short Syndrome (step 808), and the correction result is recorded. If the short syndrome calculator 602 has not processed all short codewords of the long codeword (step 810), the short syndrome calculator 602 continues to calculate short syndromes of remaining short codewords (step 804).

After short syndromes of all short codewords have been calculated, the syndrome calculator 602 then calculates a long syndrome corresponding to the long codeword (step 813). When the long syndrome is not equal to zero (step 816), the long codeword comprises error bits. The control circuit 608 then determines whether all short codewords have been successfully corrected according to the non-zero short syndromes (step 818). If the non-zero short syndromes have successfully corrected the corresponding short codewords (step 818), the control circuit 608 corrects the long syndrome according to the non-zero short syndromes (step 820). For example, if the short syndrome of the short codeword $C_{S4}$ is not equal to zero, the nonzero short syndrome is used to correct bits corresponding to the short codeword $C_{S4}$ in the long codeword. When the corrected long syndrome is equal to zero (step 822), the error bits of the long codeword is determined to have been corrected, and the correction result is sent to a host, and the long codeword does not require correction according to the long syndrome to reduce time period required by the entire decode process of the long codeword. When the corrected long syndrome is not equal to zero (step 822) or some of the non-zero short syndromes have not successfully corrected the corresponding short codewords (step 818), the control circuit 608 corrects erroneous short codewords according to the original long syndrome to obtain a long codeword without error bits (step 824), and a decode process of the long codeword is completed.

When all short syndromes are equal to zero, error in determining of correct long codewords may occur. Because the short syndrome corrects fewer error bits, when a short codeword comprises error bits with a number greater than a correction bit number of the short syndrome, the short syndrome is also determined to equal to zero. Thus, a long syndrome able to correct more error bits is required for re-determining whether long codewords are correct. For example, a long codeword may be able to correct more than 24 error bits. Thus, if a short codeword comprises 8 error bits, the long syndrome can correct the error bits of the short codeword, thereby assuring in minimal error determining of correct long codewords.

While the invention has been described by way of example and in terms of preferred embodiment, it is to be understood that the invention is not limited thereto. To the contrary, it is intended to cover various modifications and similar arrangements (as would apparent to those skilled in the art). Therefore, the scope of the appended claims should be accorded the broadest interpretation so as to encompass all such modifications and similar arrangements.

What is claimed is:

1. An operation method for a controller in a data storage device, comprising:
   receiving raw data from a host by the controller;
   dividing the raw data into a plurality of data segments by the controller;
   generating a plurality of short parities corresponding to the data segments according to a first generator polynomial by the controller;
   appending the short parities to the data segments to obtain a plurality of short codewords by the controller;
   concatenating the short codewords to obtain a code data by the controller;
   generating a long parity corresponding to the code data according to a second generator polynomial, wherein the first generator polynomial is a function of at least one minimum polynomial of the second generator polynomial by the controller; and
   appending the long parity to the code data to obtain a long codeword as an error correction code corresponding to the raw data by the controller.

2. The method as claimed in claim 1, wherein the first generator polynomial is a least common multiple of at least one minimum polynomial of the second generator polynomial.

3. The method as claimed in claim 1, wherein the method further comprises storing the long codeword in a non-transitional storage medium.

4. The method as claimed in claim 1, wherein the method further comprises:
   reading the long codeword from a non-transitional storage medium;
   retrieving the short codewords from the long codeword;
   calculating a plurality of short syndromes corresponding to the short codewords according to the short parities of the short codewords;
   determining whether the short syndromes are equal to zero; and
   when the short syndromes comprise nonzero short syndromes, correcting the short codewords according to the nonzero short syndromes.

5. The method as claimed in claim 4, wherein the method further comprises:
   calculating a long syndrome corresponding to the long codeword according to the long parity of the long codeword;
   determining whether the long syndrome is equal to zero;
   when the long syndrome is not equal to zero, determining whether the nonzero short syndromes have successfully corrected the corresponding short codewords; and
   when the nonzero short syndromes have successfully corrected the corresponding short codewords, correcting the long syndrome according to the nonzero short syndromes to obtain a corrected long syndrome.

6. The method as claimed in claim 5, wherein the method further comprises:
   when the long syndrome is not equal to zero, and the nonzero short syndromes have not successfully corrected the corresponding short codewords, correcting erroneous short codewords of the short codewords according to the long syndrome.

7. The method as claimed in claim 1, wherein the long codeword and the short codewords are Bose, Ray-Chaudhuri, and Hocquenghem (BCH) codes or Reed-Solomon (RS) codes.

8. A coder-decoder for an error correction code, comprising:
   an error correction code (ECC) encoder, receiving raw data, dividing the raw data into a plurality of data segments, generating a plurality of short parities corresponding to the data segments, appending the short parities to the data segments to obtain a plurality of short codewords, concatenating the short codewords to obtain a code data, generating a long parity corresponding to the code data, and appending the long parity to the code data to obtain a long codeword as an error correction code to be stored in a storage medium; and
   an error correction code (ECC) decoder, reading the long codeword from the storage medium, retrieving the short codewords from the long codeword, calculating a plurality of short syndromes corresponding to the short codewords according to the short parities of the short codewords, determining whether the short syndromes are equal to zero, and when the short syndromes comprise nonzero short syndromes, correcting the short codewords according to the nonzero short syndromes.

9. The coder-decoder as claimed in claim 8, wherein the ECC encoder generates the short parities corresponding to the data segments according to a first generator polynomial, and generates the long parity corresponding to the code data according to a second generator polynomial, wherein the first generator polynomial is a function of at least one minimum polynomial of the second generator polynomial.

10. The coder-decoder as claimed in claim 9, wherein the first generator polynomial is a least common multiple of at least one minimum polynomial of the second generator polynomial.

11. The coder-decoder as claimed in claim 9, wherein the ECC encoder comprises:
    a short parity encoder, generating the short parities corresponding to the data segments according to the first generator polynomial;
    a first append module, appending the short parities to the data segments to obtain the short codewords;

a long parity encoder, concatenating the short codewords to obtain the code data, and generating the long parity corresponding to the code data according to the second generator polynomial; and a second append module, appending the long parity to the code data to obtain the long codeword.

12. The coder-decoder as claimed in claim 8, wherein the ECC decoder further calculates a long syndrome corresponding to the long codeword according to the long parity of the long codeword, determines whether the long syndrome is equal to zero, determines whether the nonzero short codewords have successfully corrected the corresponding short codewords when the long syndrome is not equal to zero, and corrects the long syndrome according to the nonzero short codewords to obtain a corrected long syndrome when the nonzero short codewords have successfully corrected the corresponding short codewords.

13. The coder-decoder as claimed in claim 12, wherein when the long syndrome is not equal to zero, and the nonzero short codewords have not successfully corrected the corresponding short codewords, the ECC decoder corrects erroneous short codewords of the short codewords according to the long syndrome.

14. The coder-decoder as claimed in claim 12, wherein the ECC decoder comprises:
 a syndrome calculator, calculating the short syndromes of the short codewords according to the short parities of the short codewords, and calculating the long syndrome of the long codeword according to the long parity of the long codeword;
 a control circuit, determining whether the short syndromes are equal to zero, correcting the short codewords according to the nonzero short syndromes when the short syndromes are not equal to zero, determining whether the long syndrome is equal to zero, determining whether the nonzero short codewords have successfully corrected the corresponding short codewords when the long syndrome is not equal to zero, and correcting the long syndrome according to the nonzero short codewords to obtain a corrected long syndrome when the nonzero short codewords have successfully corrected the corresponding short codewords.

15. The coder-decoder as claimed in claim 8, wherein the long codeword and the short codewords are Bose, Ray-Chaudhuri, and Hocquenghem (BCH) codes or Reed-Solomon (RS) codes.

16. An operation method for a controller in a data storage device, comprising:
 receiving a long codeword of an error correction code from a non-transitional storage medium by the controller, wherein the long codeword comprises a plurality of short codewords and a long parity, and each of the short codewords comprises a short parity;
 retrieving the short codewords from the long codeword by the controller;
 calculating a plurality of short syndromes corresponding to the short codewords according to the short parities of the short codewords by the controller;
 determining whether the short syndromes are equal to zero by the controller;
 when the short syndromes comprise at least one nonzero short syndrome, correcting at least one corresponding short codeword according to the at least one nonzero short syndrome by the controller;
 calculating a long syndrome corresponding to the long codeword according to the long parity of the long codeword by the controller;
 determining whether the long syndrome is equal to zero by the controller;
 when the long syndrome is not equal to zero, determining whether the nonzero short syndromes have successfully corrected the corresponding short codewords by the controller; and
 when the nonzero short syndromes have successfully corrected the corresponding short codewords, correcting the long syndrome according to the nonzero short syndromes to obtain a corrected long syndrome by the controller.

17. The method as claimed in claim 16, wherein the method further comprises:
 when the long syndrome is not equal to zero, and the nonzero short syndromes have not successfully corrected the corresponding short codewords, correcting erroneous short codewords of the short codewords according to the long syndrome.

18. The method as claimed in claim 16, wherein the short parities are generated according to a first generator polynomial, and the long parity is generated according to a second generator polynomial, wherein the first generator polynomial is a function of at least one minimum polynomial of the second generator polynomial.

19. The method as claimed in claim 18, wherein the first generator polynomial is a least common multiple of at least one minimum polynomial of the second generator polynomial.

20. The method as claimed in claim 16, wherein the long codeword and the short codewords are Bose, Ray-Chaudhuri, and Hocquenghem (BCH) codes or Reed-Solomon (RS) codes.

* * * * *